(12) United States Patent
Kamei et al.

(10) Patent No.: US 10,486,324 B2
(45) Date of Patent: *Nov. 26, 2019

(54) ENTRY SHEET FOR DRILLING AND METHOD FOR DRILLING PROCESSING USING SAME

(71) Applicant: MITSUBISHI GAS CHEMICAL COMPANY, INC., Tokyo (JP)

(72) Inventors: Takayuki Kamei, Yamagata (JP); Yousuke Matsuyama, Yamagata (JP); Takaaki Ogashiwa, Yamagata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 101 days.

This patent is subject to a terminal disclaimer.

(21) Appl. No.: 15/553,795

(22) PCT Filed: Feb. 24, 2016

(86) PCT No.: PCT/JP2016/055332
§ 371 (c)(1),
(2) Date: Aug. 25, 2017

(87) PCT Pub. No.: WO2016/147817
PCT Pub. Date: Sep. 22, 2016

(65) Prior Publication Data
US 2018/0050462 A1    Feb. 22, 2018

(30) Foreign Application Priority Data

Mar. 19, 2015  (JP) .................. 2015-056155

(51) Int. Cl.
*B26F 1/16*      (2006.01)
*B23B 41/16*    (2006.01)
(Continued)

(52) U.S. Cl.
CPC ............. *B26F 1/16* (2013.01); *B23B 35/00* (2013.01); *B23B 41/16* (2013.01); *H05K 3/007* (2013.01);
(Continued)

(58) Field of Classification Search
CPC ................................................. B32B 35/00
See application file for complete search history.

(56) References Cited

U.S. PATENT DOCUMENTS 5,082,402 A * 1/1992 Gaku .................. H05K 3/0047
408/1 R
2002/0003991 A1  1/2002 Ohashi et al.
(Continued)

FOREIGN PATENT DOCUMENTS

JP        04-92494        3/1992
JP        05-169400       7/1993
(Continued)

OTHER PUBLICATIONS

International Search Report issued in Patent Application No. PCT/JP2016/055332, dated Apr. 12, 2016.
(Continued)

*Primary Examiner* — Liam J Heincer
(74) *Attorney, Agent, or Firm* — Greenblum & Bernstein, P.L.C.

(57) ABSTRACT

Entry sheet for drilling including a metallic foil and a layer of a resin composition, the layer formed on the metallic foil without interposing an adhesion layer, in which the layer of the resin composition has a peak attributable to a carbon atom-oxygen atom double bond appearing at 1700 to 1750 $cm^{-1}$ and a peak attributable to a carbon atom-oxygen atom single bond appearing at 1080 to 1300 $cm^{-1}$ in infrared spectroscopy, and when the absorbance at the peak attributable to the carbon atom-oxygen atom double bond appear- (Continued)

ing at 1700 to 1750 cm$^{-1}$ is represented by Abs(C=O)L, and the absorbance at the peak of the carbon atom-oxygen atom single bond appearing at 1080 to 1300 cm$^{-1}$ is represented by Abs(C—O)L, the layer of the resin composition has an absorbance ratio (C) of 0.12 to 1.80, the absorbance ratio (C) represented by the following expression (1).

$$\text{Absorbance ratio}(C)=\text{Abs}(C{=}O)L/\text{Abs}(C{-}O)L \quad \text{Expression (1)}.$$

10 Claims, 1 Drawing Sheet

(51) Int. Cl.
 *H05K 3/00* (2006.01)
 *B23B 35/00* (2006.01)
(52) U.S. Cl.
 CPC ........ *H05K 3/0047* (2013.01); *B23B 2250/12* (2013.01); *B26F 2210/02* (2013.01); *H05K 2203/0156* (2013.01); *H05K 2203/0214* (2013.01)

(56) References Cited

U.S. PATENT DOCUMENTS

| | | | |
|---|---|---|---|
| 2005/0003169 A1* | 1/2005 | Ikeguchi | B23B 35/00 428/195.1 |
| 2010/0167041 A1* | 7/2010 | Matsuyama | H05K 3/0047 428/304.4 |
| 2013/0078453 A1* | 3/2013 | Chang | H05K 3/0047 428/336 |
| 2015/0111049 A1* | 4/2015 | Matsuyama | H05K 3/0047 428/464 |
| 2015/0125228 A1* | 5/2015 | Sugimoto | B26F 1/16 408/1 R |
| 2016/0045961 A1* | 2/2016 | Umehara | B23B 35/00 428/596 |
| 2018/0036898 A1* | 2/2018 | Kamei | B26F 1/16 |
| 2018/0257148 A1* | 9/2018 | Kamei | B23B 41/00 |

FOREIGN PATENT DOCUMENTS

| | | |
|---|---|---|
| JP | 2001-347493 | 12/2001 |
| JP | 2003-136485 | 5/2003 |
| JP | 2004-230470 | 8/2004 |
| JP | 2009-172752 | 8/2009 |
| JP | 2011-183548 | 9/2011 |
| TW | 200938039 A | 9/2009 |
| WO | 2010/140333 | 12/2010 |

OTHER PUBLICATIONS

International Preliminary Examination Report in PCT/JP2016/055332 dated Sep. 19, 2017, with English translation.

* cited by examiner

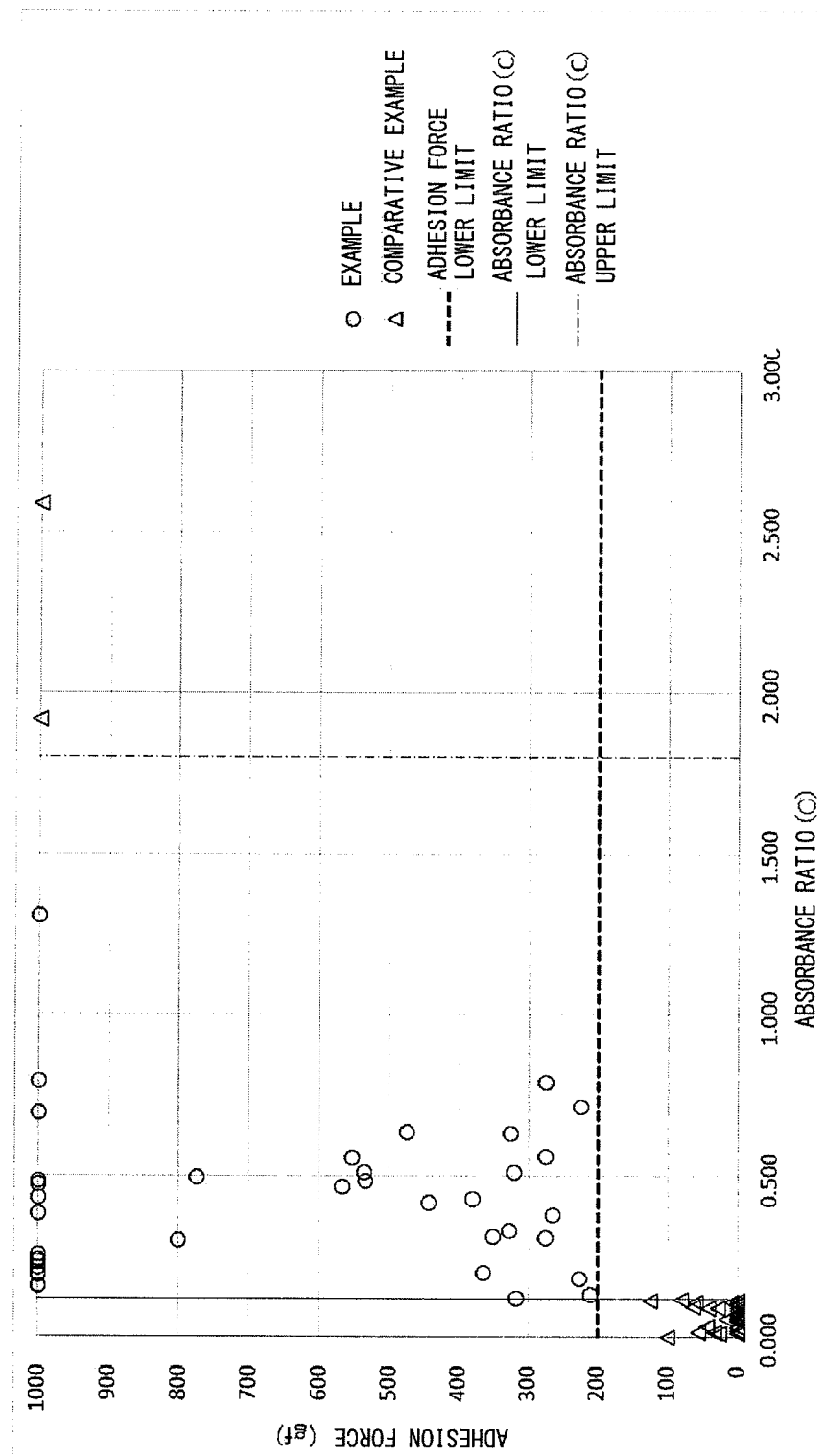

US 10,486,324 B2

ENTRY SHEET FOR DRILLING AND METHOD FOR DRILLING PROCESSING USING SAME

TECHNICAL FIELD

The present invention relates to an entry sheet for drilling and a method for drilling processing using the same.

BACKGROUND ART

As a method for drilling processing of a laminated board or a multi-layer board used in a printed wiring board material, a method has been generally adopted including piling one or more laminated boards or multi-layer boards, arranging, as an entry board, an aluminum foil alone or a sheet obtained by forming a resin composition layer on a surface of the aluminum foil (hereinafter, the "sheet" is referred to as "entry sheet for drilling") on the top of the laminated board or multi-layer board, and conducting hole boring processing. Although generally a "copper clad laminate" is often used as the laminated board, the laminated board may be a "laminated board that does not have copper foil on an outer layer". In the present invention, the laminated board refers to the "copper clad laminate" and/or the "laminated board that does not have copper foil on an outer layer" unless otherwise stated.

In recent years, improvements in reliability are demanded for printed wiring boards, and the high densification of the printed wiring boards progresses, high-quality drilling processing including the improvements in hole position accuracy and the reduction in roughness of hole walls has been demanded for the drilling processing of a laminated board or a multi-layer board.

To meet above-described demands such as the improvements in hole position accuracy and the reduction in roughness of hole walls, a method for hole boring processing using a sheet containing a water-soluble resin such as a polyethylene glycol is proposed in Patent Literature 1. Moreover, a lubricant sheet for hole boring obtained by forming a water-soluble resin layer on a metallic foil is proposed in Patent Literature 2. Further, an entry sheet for hole boring obtained by forming a water-soluble resin layer on aluminum foil provided with a thin film of a thermosetting resin formed thereon is proposed in Patent Literature 3. Furthermore, a lubricant sheet for hole boring in which a non-halogen colorant is blended in a lubricating resin composition is proposed in Patent Literature 4.

As one example of the entry sheet for drilling, an entry sheet is proposed comprising a metallic foil and a layer of a resin composition, the layer formed on at least one surface of the metallic foil. However, the adhesion strength between the metallic foil and the layer of the resin composition is weak, and therefore the layer of the resin composition is peeled during drilling processing in the configuration of the entry sheet for drilling in which the metallic foil and the layer of the resin composition are in direct contact with each other, and the drill steps on the peeled layer of the resin composition, resulting in the deterioration of the hole position accuracy and the increase in the frequency of breakage of the drill in many cases. Moreover, the entry sheet for drilling is usually used in hole boring processing in such a way that the entry sheet is arranged on both surfaces of a plurality of laminated boards or multi-layer boards to make a set with a tape for fixation; however, the tape for fixation may be peeled together with the layer of the resin composition and the position of the entry sheet may be shifted.

Therefore, the entry sheet for drilling practically used includes an adhesion layer (adhesion film) containing a urethane-based compound, a vinyl acetate-based compound, a vinyl chloride-based compound, a polyester-based compound, a copolymerized product thereof, an epoxy-based compound, a cyanate-based compound, or the like formed between the metallic foil and the layer of the resin composition in order to improve the adhesion strength between the metallic foil and the layer of the resin composition (see, for example, Patent Literature 5).

CITATION LIST

Patent Literature

Patent Literature 1
  Japanese Patent Laid-Open No. H04-92494
Patent Literature 2
  Japanese Patent Laid-Open No. H05-169400
Patent Literature 3
  Japanese Patent Laid-Open No. 2003-136485
Patent Literature 4
  Japanese Patent Laid-Open No. 2004-230470
Patent Literature 5
  Japanese Patent Laid-Open No. 2011-183548

SUMMARY OF INVENTION

Technical Problem

On the other hand, however, when the adhesion layer is provided between the metallic foil and the layer of the resin composition, the lubricating effect of the resin composition is prevented by the adhesion layer, and therefore the hole position accuracy, which is an important property required for an entry sheet for drilling, may be deteriorated. Thus, the development of an entry sheet for drilling having a strong adhesion strength between the metallic foil and the layer of the resin composition and having an excellent hole position accuracy without providing the adhesion layer between the metallic foil and the layer of the resin composition has been earnestly desired.

In consideration of the present situation, an object of the present invention is to provide an entry sheet for drilling including a metallic foil and a layer of a resin composition, the layer formed on the metallic foil without interposing an adhesion layer, and which has a strong adhesion strength between the metallic foil and the layer of the resin composition and further has an excellent hole position accuracy during drilling processing; and to provide a method for drilling processing using the entry sheet for drilling.

Solution to Problem

The present inventors have conducted various studies for the purpose of solving the problems and have found that an entry sheet for drilling including a metallic foil and a layer of the resin composition, the layer formed on the metallic foil without interposing an adhesion layer, wherein the layer of the resin composition has a peak attributable to a carbon atom-oxygen atom double bond appearing at 1700 to 1750 $cm^{-1}$ and a peak attributable to a carbon atom-oxygen atom single bond appearing at 1080 to 1300 $cm^{-1}$ in infrared spectroscopy and has an absorbance ratio (C) of the absorbance at the peak attributable to the carbon atom-oxygen atom double bond appearing at 1700 to 1750 $cm^{-1}$ to the absorbance at the peak attributable to the carbon atom-oxygen atom single bond appearing at 1080 to 1300 cm$^{-1}$ in a particular range, has a strong adhesion strength between the metallic foil and the layer of the resin composition, and further has an excellent hole position accuracy during drilling processing, thereby completed the present invention.

That is, the present invention is as follows.

[1]

An entry sheet for drilling including:

a metallic foil; and a layer of a resin composition, the layer formed on the metallic foil without interposing an adhesion layer, wherein the layer of the resin composition has a peak attributable to a carbon atom-oxygen atom double bond appearing at 1700 to 1750 cm$^{-1}$ and a peak attributable to a carbon atom-oxygen atom single bond appearing at 1080 to 1300 cm$^{-1}$ in infrared spectroscopy, and when absorbance at the peak attributable to the carbon atom-oxygen atom double bond appearing at 1700 to 1750 cm$^{-1}$ is represented by Abs(C=O)L, and an absorbance at the peak of the carbon atom-oxygen atom single bond appearing at 1080 to 1300 cm$^{-1}$ is represented by Abs(C—O)L, the layer of the resin composition has an absorbance ratio (C) of 0.12 to 1.80, the absorbance ratio (C) represented by the following expression (1).

Absorbance ratio(C)=Abs(C=O)L/Abs(C—O)L    Expression (1)

[2]

The entry sheet for drilling according to [1], wherein the resin composition contains:

a water-insoluble resin (A) having the peak attributable to the carbon atom-oxygen atom double bond appearing at 1700 to 1750 cm$^{-1}$ in the infrared spectroscopy; and a water-soluble resin (B) having the peak attributable to the carbon atom-oxygen atom single bond appearing at 1080 to 1300 cm$^{-1}$ in the infrared spectroscopy.

[3]

The entry sheet for drilling according to [2], wherein the water-insoluble resin (A) is one or more selected from the group consisting of polyurethane resins, polyester resins, acrylic-based resins, and polyolefin-based resin.

[4]

The entry sheet for drilling according to [2] or [3], wherein the water-soluble resin (B) is one or more selected from the group consisting of polyethylene oxide; polypropylene oxide; cellulose derivatives; polytetramethylene glycol; polyethylene glycol; polypropylene glycol; monoether compounds of polyoxyethylene; polyoxyethylene monostearate; polyoxyethylene sorbitan monostearate; polyglycerin monostearate compounds; and a polyoxyethylene-propylene copolymer.

[5]

The entry sheet for drilling according to [4], wherein the water-soluble resin (B) contains:

a high-molecular-weight water-soluble resin (b1) having a weight average molecular weight of 50,000 or higher and 1,000,000 or lower; and a low-molecular-weight water-soluble resin (b2) having a weight average molecular weight of 1,000 or higher and 30,000 or lower, and the high-molecular-weight water-soluble resin (b1) contains at least one selected from the group consisting of polyethylene oxide, polypropylene oxide, and cellulose derivatives, and the low-molecular-weight water-soluble resin (b2) contains at least one selected from the group consisting of polytetramethylene glycol; polyethylene glycol; polypropylene glycol; monoether compounds of polyoxyethylene; polyoxyethylene monostearate; polyoxyethylene sorbitan monostearate; polyglycerin monostearate compounds; and a polyoxyethylene-propylene copolymer.

[6]

The entry sheet for drilling according to any one of [2] to [5], wherein the resin composition contains:

20 to 80 parts by mass of the water-insoluble resin (A); and 80 to 20 parts by mass of the water-soluble resin (B) each based on 100 parts by mass of a total amount of the water-insoluble resin (A) and the water-soluble resin (B).

[7]

The entry sheet for drilling according to any one of [2] to [6], wherein the layer of the resin composition is formed using: an aqueous dispersion of the water-insoluble resin (A); and the water-soluble resin (B).

[8]

The entry sheet for drilling according to any one of [1] to [7], wherein the layer of the resin composition has a thickness of 0.02 to 0.3 mm.

[9]

The entry sheet for drilling according to any one of [1] to [8], wherein the metallic foil has a thickness of 0.05 to 0.5 mm.

[10]

A method for drilling processing comprising a hole formation step of forming a hole in a laminated board or a multi-layer board using the entry sheet for drilling according to any one of [1] to [9].

Advantageous Effects of Invention

According to the present invention, an entry sheet for drilling having a strong adhesion strength between the metallic foil and the layer of the resin composition and having an excellent hole position accuracy during drilling processing even when an adhesion layer does not exist between the metallic foil and the layer of the resin composition, and a method for drilling processing using the entry sheet for drilling can be provided. Moreover, the entry sheet for drilling not having an adhesion layer is economical in terms of both the raw material and the production process of the entry sheet.

BRIEF DESCRIPTION OF DRAWING

FIG. 1 shows a graph showing the relation between an absorbance ratio (C) in a layer of a resin composition and adhesion force between the metallic foil and the layer of the resin composition.

DESCRIPTION OF EMBODIMENTS

Hereinafter, an embodiment for carrying out the present invention (hereinafter, referred to as "the present embodiment") will be described in detail; however, the present invention is not limited to the present embodiment, and various modifications can be made within a range not departing from the scope of the present invention.

[I: Entry Sheet for Drilling]

An entry sheet for drilling according to the present embodiment includes a metallic foil and a layer of a resin composition, the layer formed on the metallic foil without interposing an adhesion layer, wherein the layer of the resin composition has a peak attributable to a carbon atom-oxygen atom double bond appearing at 1700 to 1750 cm$^{-1}$ and a peak attributable to a carbon atom-oxygen atom single bond appearing at 1080 to 1300 cm$^{-1}$ in infrared spectroscopy, and when absorbance at the peak attributable to the carbon atom-oxygen atom double bond appearing at 1700 to 1750 cm$^{-1}$ is represented by Abs(C=O)L, and absorbance at the peak attributable to the carbon atom-oxygen atom single bond appearing at 1080 to 1300 cm$^{-1}$ is represented by Abs(C—O)L, the layer of the resin composition has an absorbance ratio (C) of 0.12 to 1.80, the absorbance ratio (C) represented by the following expression (1).

$$\text{Absorbance ratio}(C)=\text{Abs}(C=O)L/\text{Abs}(C-O)L \quad (1)$$

The entry sheet for drilling according to the present embodiment comprises the metallic foil and the layer of the resin composition, the layer formed on the metallic foil without interposing an adhesion layer. That is, the entry sheet for drilling includes the metallic foil and the layer of the resin composition in direct contact with each other without having an adhesion layer (resin film) for adhering the metallic foil and the layer of the resin composition to each other. This is because the above-described configuration has the adhesion strength that is practically sufficient without interposing an adhesion layer. Since there is no need to form an adhesion layer in the entry sheet for drilling according to the present embodiment, the material cost and a step of forming the adhesion layer are unnecessary, so that the entry sheet for drilling according to the present embodiment is also more excellent in terms of economy than the conventional entry sheets for drilling. The layer of the resin composition may be formed on the one surface of the metallic foil or on both surfaces of the metallic foil. When the layer of the resin composition is formed on both surfaces of the metallic foil, the compositions of the resin composition for each layer may be the same or different.

[II: Layer of Resin Composition]

The layer of the resin composition in the present embodiment, when analyzed by infrared spectroscopy, has a peak attributable to a carbon atom-oxygen atom double bond (hereinafter, also referred to as "peak attributable to the C=O double bond") appearing at 1700 to 1750 cm$^{-1}$ and a peak attributable to a carbon atom-oxygen atom single bond (hereinafter, also referred to as "peak attributable to the C—O single bond") appearing at 1080 to 1300 cm$^{-1}$. The peak attributable to the carbon atom-oxygen atom double bond appearing at 1700 to 1750 cm$^{-1}$ herein is a peak attributable to the stretching vibration of the C=O double bond, and the peak attributable to the carbon atom-oxygen atom single bond appearing at 1080 to 1300 cm$^{-1}$ is a peak attributable to the stretching vibration of the C—O single bond. These peaks attributable to the C=O double bond and the C—O single bond are derived from the resin components that form the layer of the resin composition, as described below.

As described above, the layer of the resin composition in the present embodiment has a particular value of the ratio (C) of the absorbance at the peak attributable to the C=O double bond and the absorbance at the peak attributable to the C—O single bond. That is, it is essential that the absorbance ratio (C) represented by the expression (1) described above in the layer of the resin composition be 0.12 to 1.80. The absorbance ratio (C) is preferably 0.13 to 1.45, and particularly preferably 0.14 to 1.40. When the absorbance ratio (C) is in a range from 0.12 to 1.80, the adhesion strength between the metallic foil and the layer of the resin composition is strong, and the machining property during drilling processing is satisfactory, so that the hole position accuracy during drilling processing is excellent. It is to be noted that the Abs(C=O)L in the expression (1) described above represents the absorbance at the peak attributable to the C=O double bond in the layer of the resin composition in infrared spectroscopy, and the Abs(C—O)L represents the absorbance at the peak attributable to the C—O single bond in the layer of the resin composition in infrared spectroscopy. The Abs(C=O)L and the Abs(C—O)L each represent a value at the position where the absorbance becomes the largest in 1700 to 1750 cm$^{-1}$ and in 1080 to 1300 cm$^{-1}$, respectively. The absorbance ratio (C) can be adjusted according to the type of resin used and can be controlled, for example, by adjusting the content of a water-insoluble resin (A) having the peak attributable to the C=O double bond and the content of a water-soluble resin (B) having the peak attributable to the C—O single bond described below, respectively.

The peak position and the absorbance at the peak attributable to the C=O double bond, the peak position and the absorbance at the peak attributable to the C—O single bond, and the absorbance ratio (C) can be measured by analyzing the surface of the layer of the resin composition by infrared spectroscopy (IR). As the measurement method, it is preferable to conduct the measurement by an attenuated total reflection method (ATR method) described below.

Hereinafter, the specific measurement method will be described. The measurement can be conducted using a general Fourier transformation infrared spectrophotometer (for example, manufactured by JASCO Corporation, type number: FT/IR-6100). Firstly, the measurement of the background is conducted without setting a sample for measurement using a diamond ATR prism so that the influence from outside due to a light source and the influence due to carbon dioxide may not be reflected in infrared absorption spectra. Subsequently, the surface of the layer of the resin composition is analyzed by infrared spectroscopy. The measurement is conducted, for example, setting the cumulative number to 16 to obtain an infrared absorption spectrum in a range from 700 cm$^{-1}$ to 4000 cm$^{-1}$ taking the absorbance as the vertical axis. The obtained infrared absorption spectrum is processed in the following manner to work out the absorbance ratio (C). Firstly, the baseline correction is conducted so that the absorbance in a range from 2000 to 2100 cm$^{-1}$ in the obtained infrared absorption spectrum becomes 0 (zero). Subsequently, the peak position attributable to the C=O double bond and the peak position attributable to the C—O single bond are determined in the infrared absorption spectrum after the correction to work out the absorbance ratio (C) from the absorbances, the Abs(C=O)L and the Abs(C—O)L.

The resin component that constitutes the layer of the resin composition is not particularly limited, and examples thereof include water-insoluble resins, water-soluble resins, or mixtures thereof. Among them, it is preferable to use the water-insoluble resin (A) having the peak attributable to the C=O double bond in infrared spectroscopy and the water-soluble resin (B) having the peak attributable to the C—O single bond in infrared spectroscopy together. When the water-insoluble resin (A) and the water-soluble resin (B) are used together, there is a tendency that the adhesion strength between the metallic foil and the layer of the resin composition is further improved and the hole position accuracy during drilling processing is excellent. It is to be noted that the "water-solubility" in the present embodiment refers to a characteristic that a resin, when mixed with water, dissolves in the water, and that the "water-insolubility" refers to a characteristic that a resin, when mixed with water, does not dissolve in the water.

The method for forming the layer of the resin composition will be described in detail below, but the layer of the resin composition is particularly preferably a layer formed using an aqueous dispersion of the water-insoluble resin (A) having the peak attributable to the C=O double bond in infrared spectroscopy and the water-soluble resin (B) having the peak attributable to the C—O single bond in infrared spectroscopy. When the water-insoluble resin (A) is used as the aqueous dispersion, there is a tendency that the compatibility between the water-insoluble resin (A) and the water-soluble resin (B) is further improved and the adhesion strength between the metallic foil and the layer of the resin composition is further improved.

[III-1: Water-Insoluble Resin (A)]

The absorbance ratio (D) represented by the following expression (2) in the water-insoluble resin (A) is preferably 0.7 or more, more preferably 0.7 to 4.5, and still more preferably 0.8 to 4.5. When the absorbance ratio (D) is 0.7 or more, there is a tendency that the adhesion strength between the metallic foil and the layer of the resin composition is further improved and the peeling of the layer of the resin composition is harder to occur during drilling processing. It is to be noted that the absorbance ratio (D) in the water-insoluble resin (A) can be analyzed in the same manner as the absorbance ratio (C) in the layer of the resin composition. Moreover, the absorbance ratio (D) in the water-insoluble resin (A) can be adjusted according to the type of resin used.

Absorbance ratio(D)=Abs(C=O)A/Abs(C—O)A  Expression (2)

(wherein, Abs(C=O)A represents the absorbance at the peak attributable to the C=O double bond in the water-insoluble resin (A) in infrared spectroscopy, Abs(C—O)A represents the absorbance at the peak attributable to the C—O single bond in the water-insoluble resin (A) in infrared spectroscopy, and Abs(C=O)A and Abs(C—O)A represent a value at the position where the absorbance becomes the largest in 1700 to 1750 $cm^{-1}$ and in 1080 to 1300 $cm^{-1}$, respectively.)

It is preferable that the content of the water-insoluble resin (A) in the resin composition be 20 to 80 parts by mass, more preferably 30 to 70 parts by mass, and still more preferably 45 to 70 parts by mass based on 100 parts by mass of the total amount of the water-insoluble resin (A) and the water-soluble resin (B). When the content of the water-insoluble resin (A) is 20 parts by mass or more, there is a tendency that the adhesion strength between the metallic foil and the layer of the resin composition is further improved and the peeling of the layer of the resin composition is harder to occur during drilling processing. On the other hand, when the content of the water-insoluble resin (A) is 80 parts by mass or less, there is a tendency that the hole position accuracy during drilling processing is further excellent.

The water-insoluble resin (A) is not particularly limited, and examples thereof include polyurethane resins, polyester resins, acrylic-based resins, polyolefin-based resins, and polycarbonate resins. Among them, one or more selected from the group consisting of polyurethane resins, polyester resins, acrylic-based resins, and polyolefin-based resins are preferable. When the water-insoluble resin (A) is used, there is a tendency that the layer of the resin composition easily has an absorbance ratio (C) of 0.12 or more and 1.80 or less and the adhesion strength between the metallic foil and the layer of the resin composition is further improved. These resins may be used singly or in combinations of two or more.

[III-2: Polyurethane Resin]

Examples of the polyurethane resin that can be used as the water-insoluble resin (A) in the present embodiment include resins obtained by reacting a polyisocyanate compound, a polyol compound, and, if necessary, with another compound. Examples of the reaction for synthesizing the polyurethane resin include an acetone method, a prepolymer mixing method, a ketimine method, and a hot melt dispersion method.

The polyisocyanate compound is not particularly limited, and examples thereof include organic polyisocyanate compounds that are used for producing a usual polyurethane resin and have two or more isocyanate groups in the molecule. Specific examples thereof include: aliphatic diisocyanates such as 1,4-tetramethylene diisocyanate, 1,6-hexamethylene diisocyanate (HDI), 3-isocyanatemethyl-3,5,5-trimethylcyclohexyl isocyanate, methylcyclohexyl-2,4-diisocyanate, methylcyclohexyl-2,6-diisocyanate, xylylene diisocyanate (XDI), tetramethylxylylene diisocyanate, and lysine diisocyanate; aromatic diisocyanates such as 1,5'-naphthene diisocyanate, tolidine diisocyanate, diphenylmethylmethane diisocyanate, tetraalkyldiphenylmethane diisocyanates, 4,4'-dibenzyl diisocyanate, and 1,3-phenylene diisocyanate; and triisocyanates such as lysine ester triisocyanate, triphenylmethane triisocyanate, 1,6,11-undecane triisocyanate, 1,8-isocyanate-4,4-isocyanate methyl octane, 1,3,6-hexamethylene triisocyanate, bicyclo heptane triisocyanate, adducts of trimethylolpropane and toluylene diisocyanate, and adducts of trimethylolpropane and 1,6-hexamethylene diisocyanate. These compounds may be used singly or in combinations of two or more.

The polyol compound is not particularly limited, and examples thereof include polyol compounds that are used for producing a usual polyurethane and have two or more hydroxy groups in the molecule. Specific examples of the polyol compound include: polyhydric alcohols such as ethylene glycol, diethylene glycol, propylene glycol, 1,4-butanediol, 1,6-hexanediol, neopentyl glycol, trimethylolpropane, and glycerin; polyether polyol compounds such as polyethylene glycol, polypropylene glycol, and polytetramethylene ether glycol; polyester polyol compounds obtained from a dicarboxylic acid such as adipic acid, sebacic acid, itaconic acid, maleic anhydride, terephthalic acid, isophthalic acid, fumaric acid, succinic acid, oxalic acid, malonic acid, glutaric acid, pimelic acid, suberic acid, and azelaic acid and a polyhydric alcohol such as ethylene glycol, diethylene glycol, propylene glycol, 1,4-butanediol, 1,6-hexanediol, neopentyl glycol, 1,2-propanediol, 1,3-propanediol, 1,9-nonanediol, 3-methyl-1,5-pentanediol, 1,3-propanediol, tripropylene glycol, trimethylolpropane, and glycerin; polylactone-based polyester polyol compounds such as polycaprolactone polyols and poly β-methyl-δ-valerolactone; and polybutadiene polyols or hydrogenated products thereof, polycarbonate polyols, polythioether polyols, and polyacrylate polyols. These compounds may be used singly or in combinations of two or more.

As described above, it is preferable that the polyurethane resin that is used as the water-insoluble resin (A) be used in a state of the aqueous dispersion to form the layer of the resin composition according to the present embodiment. The solid content of the resin contained in the aqueous dispersion of the polyurethane resin is not particularly limited but is preferably 20 to 50% by mass from the viewpoint of the stability of the aqueous dispersion. The method for producing the aqueous dispersion of the polyurethane resin is not particularly limited, and the aqueous dispersion of the polyurethane resin can be produced by a publicly known method. Among others, it is preferable that the polyurethane resin synthesized from the above-described compounds and the like have a hydrophilic group in the molecule from the viewpoint of the improvement in dispersibility of the polyurethane resin component in water. As the hydrophilic group, anionic groups such as a sulfonyl group and a carboxyl group are preferable, and the carboxyl group is particularly preferable.

When the hydrophilic group is the anionic group, it is preferable that the anionic group be neutralized with a neutralizing agent. The neutralizing agent is not particularly limited, and examples thereof include: tertiary amine compounds such as triethylamine and triethanolamine; inorganic alkaline compounds such as sodium hydroxide; and ammonia.

If necessary, a compound to be a chain extender may be used in producing the aqueous dispersion of the polyurethane resin. The chain extender is not particularly limited, and examples thereof include: diamines such as ethylenediamine, 1,4-butanediamine, and 1,6-hexanediamine; tertiary amino alcohols such as triethanolamine; and monoalcohols such as methanol, ethanol, and butanol.

The solvent in producing the aqueous dispersion of the polyurethane resin is usually an aqueous solvent, and, further, an organic solvent that does not have an isocyanate group can be used together. For example, ethyl acetate, acetone, methyl ethyl ketone, isopropyl alcohol, methanol, ethanol, and the like can be used. The amount of the organic solvents to be added is generally 1 to 100 parts by mass based on 100 parts by mass of the water content in the aqueous dispersion of the polyurethane resin.

As the aqueous dispersion of the polyurethane resin, a commercially available product may be used as it is. Examples of the commercially available aqueous dispersion of the polyurethane resin include SUPERFLEX 210, SUPERFLEX 820, and SUPERFLEX 860, all manufactured by DKS Co. Ltd., and HYDRAN AP 10, HYDRAN AP 201, and HYDRAN AP 30F, all manufactured by DIC Corporation. When the aqueous dispersions of the water-insoluble resin (A) are used, there is a tendency that the adhesion strength between the metallic foil and the layer of the resin composition is further improved.

[III-3: Polyester Resin]

Examples of the polyester resin that can be used as the water-insoluble resin (A) in the present embodiment include polyester resins obtained by subjecting a raw material containing a polyol compound having two or more hydroxyl groups and a polybasic carboxylic acid having two or more carboxyl groups to condensation polymerization.

The polyol compound is not particularly limited as long as the polyol compound has two or more hydroxyl groups, and examples thereof include ethylene glycol, diethylene glycol, 1,3-propane diol, 1,2-propanediol, triethylene glycol, 2-methyl-1,3-propanediol, 2,2-dimethyl-1,3-propanediol, 2-butyl-2-ethyl-1,3-propanediol, 1,4-butanediol, 2-methyl-1,4-butanediol, 2-methyl-3-methyl-1,4-butanediol, 3-methyl-1,5-pentanediol, 1,5-pentanediol, 3-methyl-1,5-pentanediol, and 1,6-hexanediol. Moreover, examples of the polyol compound include ethylene oxide adducts of bisphenol A and propylene oxide adducts of bisphenol A as a glycol having a divalent aromatic structure, sorbitol, hexane-1,2,3,6-tetrol, 1,4-sorbitan, pentaerythritol, dipentaerythritol, tripentaerythritol, 1,2,4-butanetriol, 1,2,5-pentanetriol, glycerol, 2-methylpropanetriol, 2-methyl-1,2,4-butanetriol, trimethylolethane, trimethylolpropane, and 1,3,5-trihydroxymethylbenzene. These compounds may be used singly or in combinations of two or more.

The polybasic carboxylic acid is not particularly limited as long as the polybasic carboxylic acid has two or more carboxyl groups, and examples thereof include terephthalic acid, isophthalic acid, orthophthalic acid, 2,6-naphthalenedicarboxylic acid, 1,2-cyclohexanedicarboxylic acid, 1,3-cyclohexanedicarboxylic acid, 1,4-cyclohexanedicarboxylic acid, 1,2,4-benzenetricarboxylic acid, 2,5,7-naphthalenetricarboxylic acid, 1,2,4-naphthalenetricarboxylic acid, 1,2,4-butanetricarboxylic acid, 1,2,5-hexanetricarboxylic acid, 1,3-dicarboxyl-2-methyl-2-methylenecarboxyl propane, 1,2,4-cyclohexanetricarboxylic acid, tetra(methylenecarboxyl)methane, 1,2,7,8-octanetetracarboxylic acid, and pyromellitic acid. These compounds may be used singly or in combinations of two or more.

As described above, it is preferable that the polyester resin that is used as the water-insoluble resin (A) be used in a state of the aqueous dispersion to form the layer of the resin composition according to the present embodiment. The solid content of the resin contained in the aqueous dispersion of the polyester resin is not particularly limited but is preferably 20 to 50% by mass from the viewpoint of the stability of the aqueous dispersion. The method for producing the aqueous dispersion of the polyester resin is not particularly limited, and the aqueous dispersion of the polyester resin can be produced by a publicly known method. It is to be noted that the aqueous dispersion of the polyester resin herein means a dispersion in which the polyester resin having hydrophobic moieties and hydrophilic moieties in the molecule thereof is dispersed stably in water in such a form that the hydrophilic moieties surround the hydrophobic moieties.

The polyester resin may be a resin in which a component having a hydrophilic group such as a carboxyl group or a sulfonic acid group is further copolymerized for the purpose of improving the dispersibility of the polyester resin to water. As the component having a hydrophilic group, for example, trimellitic acid, pyromellitic acid, and trimesic acid can be used, and the polyester resin obtained by neutralizing the obtained copolymer with an amine compound or an inorganic alkaline compound such as ammonia or sodium hydroxide can be used.

As the aqueous dispersion of the polyester resin, a commercially available product may be used it is. Examples of the commercially available aqueous dispersion of the polyester resins include Vylonal MD 1100, Vylonal MD 1480, and Vylonal MD 1985, all manufactured by Toyobo Co., Ltd. These aqueous dispersions are particularly preferable as the aqueous dispersion of the water-insoluble resin (A) that can be used in forming the layer of the resin composition according to the present embodiment. This is because the adhesion strength between the metallic foil and the layer of the resin composition can be made particularly strong.

[III-4: Acrylic-Based Resin]

The acrylic-based resin that can be as the water-insoluble resin (A) in the present embodiment is not particularly limited as long as the acrylic-based resin is a copolymer using an unsaturated carboxylic acid compound as a main constituent. The unsaturated carboxylic acid compound is not particularly limited, and examples thereof include: α,β-unsaturated carboxylates (also referred to as ethylenically unsaturated carboxylates) such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, n-octyl (meth)acrylate, isononyl (meth)acrylate, cyclohexyl (meth)acrylate, methylcyclohexyl (meth)acrylate, t-butylcyclohexyl (meth)acrylate, cyclododecyl (meth)acrylate, isobornyl (meth)acrylate, 2-hydroxyethyl (meth)acrylate, 3-hydroxypropyl (meth)

acrylate, 4-hydroxybutyl (meth)acrylate, glycidyl (meth) acrylate, polyethylene glycol (meth)acrylate, polypropylene glycol (meth)acrylate, and polyethylene-polypropylene glycol mono(meth)acrylate; monoalkyl esters of an unsaturated dicarboxylic acid, such as monoethyl itaconate and monobutyl fumarate; α,β-unsaturated carboxylic acids (also referred to as ethylenically unsaturated carboxylic acids) and unsaturated dicarboxylic acids such as (meth)acrylic acid, itaconic acid, maleic acid, and fumaric acid; α,β-unsaturated carboxylic acid amides (also referred to as ethylenically unsaturated carboxylic acid amides) and N-substituted compounds thereof such as acrylamide, N-methylolacrylamide, N-methoxy methyl acrylamide, N-methoxy butyl acrylamide, and diacetone acrylamide; unsaturated alcohols such as allyl alcohol; α,β-unsaturated nitriles (also referred to as ethylenically unsaturated nitriles) such as (meth)acrylonitrile; and vinyl acetate. These compounds may be used singly or in combinations of two or more.

As described above, it is preferable that the acrylic-based resin that is used as the water-insoluble resin (A) be used in a state of the aqueous dispersion to form the layer of the resin composition according to the present embodiment. The solid content of the resin contained in the aqueous dispersion of the acrylic-based resin is not particularly limited but is preferably 20 to 50% by mass from the viewpoint of the stability of the aqueous dispersion. The method for producing the aqueous dispersion of the acrylic-based resin is not particularly limited, and the aqueous dispersion of the acrylic-based resin can be produced by a publicly known method. Specific examples include: a method in which acrylic compounds are co-polymerized in an organic solvent such as methyl ethyl ketone, acetone, or ethyl acetate, the organic solvent is then evaporated, and thereafter carboxyl groups are neutralized with an amine compound or an inorganic alkaline compound such as ammonia or sodium hydroxide in an aqueous solvent to disperse the copolymerized product; a method in which an acrylic compound and an emulsifying agent having an anionic hydrophilic group such as a carboxyl group or a sulfonic acid group, or an acrylic compound and a compound having a nonionic hydrophilic group, such as a monoether compound or a monoester compound including a polyethylene glycol or a polypropylene glycol, are mixed in an aqueous solvent, and the resultant mixture is subjected to emulsion polymerization; and, further, a method in which a component having hydrophilicity such as a carboxyl group or a sulfonic acid group and an acrylic compound are co-polymerized for self-emulsification.

As the aqueous dispersion of the acrylic-based resin, a commercially available product may be used as it is. Examples of the commercially available aqueous dispersion of the acrylic-based resin include VONCOAT AK 3090, VONCOAT AN 678AE, and VONCOAT MAT 200E, all manufactured by DIC Corporation. These aqueous dispersions are particularly preferable as the aqueous dispersion of the water-insoluble resin (A) that can be used in forming the layer of the resin composition according to the present embodiment. This is because the adhesion strength between the metallic foil and the layer of the resin composition can be made particularly strong.

[III-5: Polyolefin-Based Resin]

Examples of the polyolefin-based resin that can be used as the water-insoluble resin (A) in the present embodiment include resins using an olefin such as ethylene or propylene as a main constituent. Examples of the resins include copolymers of an olefin and an unsaturated carboxylic acid (hereinafter, also referred to as "olefin-unsaturated carboxylic acid copolymers"). The olefin is not particularly limited, but ethylene, propylene, and butylene are preferable, and ethylene is particularly preferable among them. The unsaturated carboxylic acid is not particularly limited, but (meth)acrylic acid (namely, acrylic acid or methacrylic acid), maleic acid, itaconic acid, and fumaric acid are preferable, and (meth)acrylic acid is more preferable among others. As the olefin-unsaturated carboxylic acid copolymer, copolymers of ethylene and (meth)acrylic acid and copolymers of propylene and (meth)acrylic acid are particularly preferable.

As describe above, it is preferable that the polyolefin-based resin that is used as the water-insoluble resin (A) be used in a state of the aqueous dispersion to form the layer of the resin composition according to the present embodiment. The solid content of the resin contained in the aqueous dispersion of the polyolefin-based resin is not particularly limited but is preferably 20 to 50% by mass from the viewpoint of the stability of the aqueous dispersion. The method for producing the aqueous dispersion of the polyolefin-based resin is not particularly limited, and the aqueous dispersion of the polyolefin-based resin can be produced by a publicly known method. Examples of the method include a method in which the above-described olefin-unsaturated carboxylic acid copolymer, an aqueous solvent, and, if necessary, an additional component such as a base or an emulsifying agent are stirred using a solid-liquid stirring apparatus or the like.

Examples of the base that is used for producing the aqueous dispersion of the polyolefin-based resin include: ammonia; amine compounds such as diethylamine, triethylamine, monoethanolamine, dimethylethanolamine, and diethylethanolamine; and sodium hydroxide.

As the aqueous dispersion of the polyolefin-based resin, a commercially available product may be used as it is. Examples of the commercially available aqueous dispersion of the polyolefin-based resin include ZAIKTHENE AC manufactured by Sumitomo Seika Chemicals Company Limited. ZAIKTHENE AC is particularly preferable as the aqueous dispersion of the water-insoluble resin (A) that can be used in forming the layer of the resin composition according to the present embodiment. This is because the adhesion strength between the metallic foil and the layer of the resin composition can be made particularly strong.

[IV: Water-Soluble Resin (B)]

The water-soluble resin (B) is not particularly limited as long as the water-soluble resin (B) is a resin having water-solubility; it is preferable to use a high-molecular-weight water-soluble resin (b1) and a low-molecular-weight water-soluble resin (b2) together. Among others, it is preferable to use the high-molecular-weight water-soluble resin (b1) having the peak attributable to the C—O single bond in infrared spectroscopy and a low-molecular-weight water-soluble resin (b2) having the peak attributable to the C—O single bond in infrared spectroscopy together.

It is preferable that the content of the water-soluble resin (B) in the resin composition be 20 to 80 parts by mass, more preferably 30 to 70 parts by mass, and still more preferably 30 to 65 parts by mass based on 100 parts by mass of the total amount of the water-insoluble resin (A) and the water-soluble resin (B). When the content of the water-soluble resin (B) is 20 parts by mass or more, there is a tendency that a further uniform layer of the resin composition can be formed. On the other hand, when the content of the water-soluble resin (B) is 80 parts by mass or less, there is a tendency that the hole position accuracy is further excellent during drilling processing.

The high-molecular-weight water-soluble resin (b1) is not particularly limited and preferably contains one or more selected from the group consisting of polyethylene oxide, polypropylene oxide, and cellulose derivatives. These compounds are resin components each having the peak attributable to the C—O single bond at 1080 to 1300 cm$^{-1}$ in infrared spectroscopy. These compounds may be used singly or in combinations of two or more. It is preferable that the high-molecular-weight water-soluble resin (b1) have a weight average molecular weight of 50,000 or higher and 1,000,000 or lower from the viewpoint of improving the film forming property of the layer of the resin composition.

The low-molecular-weight water-soluble resin (b2) is not particularly limited and examples thereof include: glycol compounds such as polyethylene glycol, polypropylene glycol, and polytetramethylene glycol; monoether compounds of polyoxyethylene such as polyoxyethylene oleyl ether, polyoxyethylene cetyl ether, polyoxyethylene stearyl ether, polyoxyethylene lauryl ether, polyoxyethylene nonylphenyl ether, and polyoxyethylene octylphenyl ether; and polyoxyethylene monostearate, polyoxyethylene sorbitan monostearate, polyglycerin monostearate compounds, and a polyoxyethylene-propylene copolymer. Among these, it is preferable that the low-molecular-weight water-soluble resin (b2) contain at least one selected from the group consisting of polytetramethylene glycol, polyethylene glycol, polypropylene glycol, monoether compounds of polyoxyethylene, polyoxyethylene monostearate, polyoxyethylene sorbitan monostearate, polyglycerin monostearate compounds, and a polyoxyethylene-propylene copolymer. These compounds are resin components each having the peak attributable to the C—O single bond at 1080 to 1300 cm$^{-1}$ in infrared spectroscopy. These compounds and copolymers may be used singly or in combinations of two or more. It is preferable that the low-molecular-weight water-soluble resin (b2) have a weight average molecular weight of 1,000 or higher and 30,000 or lower from the viewpoint of improving the lubricating property during drilling processing.

Among the above-described water-soluble resins, it is preferable to use as the water-soluble resin (B), one or more selected from the group consisting of polyethylene oxide, polypropylene oxide, cellulose derivatives, polytetramethylene glycol, polyethylene glycol, polypropylene glycol, monoether compounds of polyoxyethylene, polyoxyethylene monostearate, polyoxyethylene sorbitan monostearate, polyglycerin monostearate compounds, and a polyoxyethylene-propylene copolymer. When such a water-soluble resin (B) is used, there is a tendency that the film forming property of the layer of the resin composition and the hole position accuracy are further improved.

Moreover, particularly in the case where the water-soluble resin (B) contains the high-molecular-weight water-soluble resin (b1) having a weight average molecular weight of 50,000 or higher and 1,000,000 or lower and the low-molecular-weight water-soluble resin (b2) having a weight average molecular weight of 1,000 or higher and 30,000 or lower, it is preferable that the high-molecular-weight water-soluble resin (b1) contain at least one selected from the group consisting of polyethylene oxide, polypropylene oxide, and cellulose derivatives, and the low-molecular-weight water-soluble resin (b2) contain at least one selected from the group consisting of polytetramethylene glycol, polyethylene glycol, polypropylene glycol, monoether compounds of polyoxyethylene, polyoxyethylene monostearate, polyoxyethylene sorbitan monostearate, polyglycerin monostearate compounds, and a polyoxyethylene-propylene copolymer. When such a water-soluble resin (B) is used, there is a tendency that the film forming property of the layer of the resin composition and the hole position accuracy are further improved.

The content of the high-molecular-weight water-soluble resin (b1) is preferably 1 to 15 parts by mass, more preferably 2.5 to 10 parts by mass, and still more preferably 5 to 8 parts by mass based on 100 parts by mass of the total amount of the water-insoluble resin (A) and the water-soluble resin (B). When the content of the high-molecular-weight water-soluble resin (b1) is in the range, there is a tendency that the film forming property of the layer of the resin composition and the hole position accuracy are further improved.

The content of the low-molecular-weight water-soluble resin (b2) is preferably 30 to 75 parts by mass, more preferably 40 to 75 parts by mass, and still more preferably 45 to 72 parts by mass based on 100 parts by mass of the total amount of the water-insoluble resin (A) and the water-soluble resin (B). When the content of the low-molecular-weight water-soluble resin (b2) is in the range, there is a tendency that the film forming property of the layer of the resin composition and the hole position accuracy are further improved.

[V: Other Components]

If necessary, the layer of the resin composition may contain an additive. The type of additive is not particularly limited, and examples thereof include a surface conditioner, a leveling agent, an antistatic agent, an emulsifying agent, an antifoaming agent, a wax additive, a coupling agent, a rheology control agent, an antiseptic agent, an antifungal agent, an antioxidant, a light stabilizer, a nucleating agent such as Na formate, a solid lubricant such as graphite, an organic filler, an inorganic filler, a heat stabilizer, and a coloring agent.

The thickness of the layer of the resin composition in the present embodiment is appropriately selected according to the diameter of the drill bit that is used in conducting drilling processing, the constitution of the object of hole boring to which processing is conducted (for example, printed wiring board material such as laminated board or multi-layer board), and the like. Among others, it is preferable that the layer of the resin composition have a thickness in a range from 0.02 to 0.3 mm, more preferably in a range from 0.02 to 0.2 mm, and still more preferably in a range from 0.02 to 0.1 mm. When the layer of the resin composition has a thickness of 0.02 mm or more, a further sufficient lubricating effect can be obtained to reduce the load to the drill bit, so that there is a tendency that the breakage of the drill bit can be further suppressed. Moreover, when the resin composition layer has a thickness of 0.3 mm or less, there is a tendency that winding of the resin composition to the drill bit can be suppressed.

[VI: Metallic Foil]

The metallic foil that is used for the entry sheet for drilling in the present embodiment is not particularly limited but is preferably a metallic material that has high adhesion with the resin composition layer and can endure the shock by the drill bit. Examples of the kind of metal of the metallic foil include aluminum from the viewpoint of availability, cost, and processability. It is preferable that the material quality of aluminum foil be aluminum having a purity of 95% or more. Examples of such aluminum foil include 5052, 3004, 3003, 1N30, 1N99, 1050, 1070, 1085, and 8021 specified in JIS-H4160. By using aluminum foil having an aluminum purity of 95% or more as the metallic foil, the shock by the drill bit is lessened, the biting property with the tip of the drill bit is improved, and these are coupled with the lubricating effect to the drill bit by the resin composition to enable the hole position accuracy of processed holes to be enhanced further.

The metallic foil preferably has a thickness of 0.05 to 0.5 mm, more preferably 0.05 to 0.3 mm, and still more preferably 0.05 to 0.2 mm. When the metallic foil has a thickness of 0.05 mm or more, there is a tendency that the generation of burrs from the object of hole boring (for example, laminated board) during drilling processing can be suppressed further. Moreover, when the metallic foil has a thickness of 0.5 mm or less, there is a tendency that the discharge of chips generated during drilling processing becomes easier.

The thickness of each layer that constitutes the entry sheet for drilling according to the present embodiment is measured in the following manner. Firstly, the entry sheet is cut in the lamination direction of each layer using a cross-section polisher (manufactured by JEOL Ltd., trade name "CROSS-SECTION POLISHER SM-09010") or an ultra-microtome (manufactured by Leica, item number "EM UC7"). Thereafter, the cross section appeared by cutting is observed from a vertical direction relative to the cross section to measure the thicknesses of each constituent layer, such as, for example, the metallic foil and the layer of the resin composition, using a SEM (Scanning Electron Microscope, manufactured by KEYENCE CORPORATION, item number "VE-7800"). The thicknesses at 5 points to 1 view are measured, and the mean is determined to be the thickness of each layer.

[VII: Method for Producing Entry Sheet for Drilling]

The method for producing the entry sheet for drilling according to the present embodiment is not particularly limited, and the entry sheet for drilling according to the present embodiment can be produced, for example, in the following manner. The entry sheet for drilling according to the present embodiment is produced in such a way that the layer of the resin composition is formed on at least one surface of the metallic foil. The method for forming the layer of the resin composition is not particularly limited, and publicly known methods can be used. Examples of the methods include a method in which a solution of the resin composition, which is obtained by dissolving or dispersing the aqueous dispersion of the water-insoluble resin (A); and the water-soluble resin (B) in a solvent, is applied on the metallic foil by a coating method or the like, and then the applied solution is further dried and/or cooled to be solidified.

In the case where the layer of the resin composition is formed by applying the solution of the resin composition on the metallic foil by a coating method or the like and then drying the applied solution, it is preferable that the solvent that is used in the solution of the resin composition be a mixed solution containing water and a solvent having a boiling point that is lower than the boiling point of water. The use of the mixed solution containing water and the solvent having a boiling point that is lower than the boiling point of water contributes to the reduction of residual bubbles in the layer of the resin composition. The type of solvent having a boiling point that is lower than the boiling point of water is not particularly limited, but examples thereof include alcoholic compounds such as ethanol, methanol, and isopropyl alcohol, and a low boiling point solvent such as methyl ethyl ketone and acetone can also be used. As another solvent, a solvent obtained by mixing tetrahydrofuran or acetonitrile, which has a high compatibility with the resin composition, in water or the alcoholic compound can be used.

[VIII: Method for Drilling Processing]

The method for drilling processing according to the present embodiment includes a hole formation step of forming a hole in a laminated board or a multi-layer board using the entry sheet for drilling. Moreover, when the drilling processing is conducted with a drill bit having a diameter (drill bit diameter) of 0.30 mmφ or less, the object of the present embodiment can be achieved further efficiently and surely. Particularly, the drilling processing, when used for the drill bits having a small diameter, as small as a diameter of 0.05 mmφ or more and 0.30 mmφ or less, further, as small as a diameter of 0.05 mmφ or more and 0.20 mmφ or less where the hole position accuracy matters, is suitable in that the hole position accuracy and the life of the drills are greatly improved. It is to be noted that the drill bit diameter of 0.05 mmφ is the lower limit of the diameter for available drill bits, and if a drill bit having a diameter smaller than that becomes available, the above-described range becomes different. Moreover, there is no problem even when the entry sheet for drilling according to the present embodiment is adopted for drilling processing in which a drill bit having a diameter exceeding 0.30 mmφ is used.

The entry sheet for drilling according to the present embodiment can be used suitably in conducting drilling processing for, for example, a printed wiring board material, more specifically, a laminated board or a multi-layer board. Specifically, the drilling processing can be conducted from the upper surface (layer side of resin composition) of the entry sheet for drilling by arranging the entry sheet on at least the top surface of a laminated board or a multi-layer board or a plurality of piled laminated boards or piled multi-layer boards (a printed wiring board material) so that the metallic foil side can be in contact with the printed wiring board material.

EXAMPLES

Hereinafter, the effects of Examples according to the present invention will be described comparing with Comparative Examples that are out of the range of the present invention. It is to be noted that "polyethylene glycol" is sometimes abbreviated as "PEG", "polyethylene oxide" as "PEO", "aqueous dispersion of polyurethane resin" as "polyurethane resin", "aqueous dispersion of polyester resin" as "polyester resin", "aqueous dispersion of acrylic-based resin" as "acrylic-based resin", and "aqueous dispersion of polyolefin-based resin" as "polyolefin-based resin".

Hereinafter, the infrared spectroscopy, the method for measuring the adhesion force, and the method for measuring the hole position accuracy will be described.

<Infrared Spectroscopy>

The measurement of the peak position in IR of the layer of the resin composition, the absorbance ratio (C) in the layer of the resin composition, and the absorbance ratio (D) in the water-insoluble resin (A) in Examples and Comparative Examples was conducted using a Fourier transformation infrared spectrophotometer (manufactured by JASCO Corporation, type number: FT/IR-6100). Firstly, the measurement of the background was conducted without setting a sample for measurement using a diamond ATR prism so that the influence from outside due to a light source and the influence due to carbon dioxide might not be reflected in infrared absorption spectra. Subsequently, the surface of the layer of the resin composition was analyzed by infrared spectroscopy. In that case, the measurement was conducted setting the cumulative number to 16 to obtain an infrared absorption spectrum taking a wavelength range from 700 $cm^{-1}$ to 4000 $cm^{-1}$ as the horizontal axis and the absorbance (Abs) as the vertical axis. The baseline correction was conducted so that the absorbance in a range from 2000 to 2100 $cm^{-1}$ in the obtained infrared absorption spectrum became 0 (zero). Subsequently, the peak position attributable to the C=O double bond and the peak position attributable to the C—O single bond were determined in the infrared absorption spectrum after the correction to work out the absorbance ratio (C) from the absorbances, the Abs (C=O)L and the Abs(C—O)L. It is to be noted that the absorbance at the peak attributable to the C=O double bond, the "Abs(C=O)L", was determined as a value at the position where the absorbance became the largest in a range from 1700 to 1750 $cm^{-1}$ in the analysis of the layer of the resin composition by infrared spectroscopy. Moreover, the absorbance at the peak attributable to the C—O single bond, the "Abs(C—O)L," was determined as a value at the position where the absorbance became the largest in a range from 1080 to 1300 $cm^{-1}$ in the analysis of the layer of the resin composition by infrared spectroscopy.

The peak position attributable to the C=O double bond, the peak position attributable to the C—O single bond, and the absorbance ratio (D) in the water-insoluble resin (A), and the peak position of the C—O single bond in the water-soluble resin (B) were measured in the same manner as described above. Specifically, a layer consisting of only the water-insoluble resin (A) or the water-soluble resin (B) was made, and the analysis of the surface of the layer by infrared spectroscopy was conducted in the same manner as described above. It is to be noted that the absorbance at the peak attributable to the C=O double bond, the "Abs(C=O) A", was determined as a value at the position where the absorbance became the largest in a range from 1700 to 1750 $cm^{-1}$ in the analysis of the water-insoluble resin (A) by infrared spectroscopy. Moreover, the absorbance at the peak attributable to the C—O single bond, the "Abs(C—O)A," was determined as a value at the position where the absorbance became the largest in a range from 1080 to 1300 $cm^{-1}$ in the analysis of the water-insoluble resin (A) by infrared spectroscopy.

<Method for Measuring Adhesion Force>

The adhesion force was measured in the following manner. Firstly, three samples were each prepared by cutting each entry sheet for drilling made in Examples and Comparative Examples in a width of 3 mm and a length of 100 mm. Subsequently, a double-sided tape was stuck to the whole surface of the layer of the resin composition on each sample. Thereafter, one edge of the samples, to which the double-sided tape was stuck, was peeled in a length of 10 mm, and a jig for attaching a spring scale was attached to the metallic foil portion in the peeled samples. The spring scale (manufactured by Sanko Seikohjyo Co. Ltd., maximum measurable value of 1000 gf) was attached to the jig, and was pulled at a speed of 1 cm/sec to read the numerical value shown by the spring scale. The measurement was conducted for the three samples, and the mean of the three numerical values was determined as the numerical value of the adhesion force. When the metallic foil and the layer of the resin composition were not peeled, the result was denoted as ">1000".

<Measurement of Hole Position Accuracy>

The hole position accuracy was measured in the following manner. Each entry sheet for drilling made in Examples and Comparative Examples was arranged, with the side of the layer of the resin composition on the upper side, on the upper surface of a copper clad laminate obtained by piling 5 copper clad laminates (trade name: HL 832, thickness of copper foil of 12 μm, double-sided board, manufactured by Mitsubishi Gas Chemical Company, Inc.) each having a thickness of 0.2 mm, and an entry board (paper phenolic laminated board, manufactured by RISHO KOGYO CO., LTD.) having a thickness of 1.5 mm was arranged at the back surface (lower surface) of the lowest board of the piled copper clad laminates. Drilling processing of 6,000 holes in total was conducted under the conditions of the number of rotations: 200,000 rpm, the feeding speed: 2.6 m/min, and the number of holes bored: 3,000 holes per one drill bit with 0.2 mmφ drill bits (trade name: C-CFU020S manufactured by Tungaloy Corporation).

The shift of the hole position at the back surface (lower surface) of the lowest board of the piled copper clad laminates from the designated coordinate was measured for the 3,000th hole (first drill bit) and the 6,000th hole (second drill bit) using a hole analyzer (type number: HA-1AM, manufactured by Hitachi Via Mechanics, Ltd.). The mean and the standard deviation (σ) of the obtained shifts were calculated to work out the "mean+3σ" for each drill bit. Thereafter, as the hole position accuracy of the whole drilling processing, the mean of the "mean+3σ" for each drill bit was worked out for two drill bits used. The expression used for working out the hole position accuracy is as represented by follows.

$$\text{Hole position accuracy of whole drilling processing (μm)} = \left(\sum_{i=1}^{n} \text{"mean} + 3\sigma\text{"}_i \text{ of drill bit}\right) \div n$$

(In the expression, n represents the number of drills used.)

The water-insoluble resins (A), the water-soluble resins (B), the additives, the solvents, and the specification of the metallic foil, which were used for producing the entry sheets for drilling of Examples and Comparative Examples, are shown in Table 1. The solid content of the resin in the water-insoluble resin (A) in Table 1 represents the amount (% by mass) of the solid content of the resin in the aqueous dispersion of the water-insoluble resin (A). The polyethylene oxide and the polyethylene glycol used as the water-soluble resin (B) do not have a carbon atom-oxygen atom double bond and therefore are denoted as "-".

TABLE 1

| | Raw material | Trade name | Sign | Manufacturer | Water-insoluble resin (A) Peak position attributable to C—O bond cm$^{-1}$ | Peak position attributable to C=O bond cm$^{-1}$ | Absorbance ratio (D) Abs(C=O)A/ Abs(C—O)A | Solid content of resin in water-insoluble resin (A) % by mass |
|---|---|---|---|---|---|---|---|---|
| Water-insoluble resin (A) | Polyurethane resin | SUPERFLEX 820 | a | DKS Co. Ltd. | 1272 | 1718 | 0.891 | 30 |
| | Polyurethane resin | SUPERFLEX 860 | b | DKS Co. Ltd. | 1241 | 1722 | 1.282 | 40 |
| | Polyurethane resin | SUPERFLEX 210 | c | DKS Co. Ltd. | 1102 | 1721 | 1.499 | 35 |
| | Polyurethane resin | SUPERFLEX 130 | d | DKS Co. Ltd. | 1088 | 1697 | 1.789 | 35 |
| | Polyurethane resin | SUPERFLEX 300 | e | DKS Co. Ltd. | 1171 | 1731 | 1.313 | 30 |
| | Polyurethane resin | SUPERFLEX 500M | f | DKS Co. Ltd. | 1115 | 1730 | 1.220 | 38 |
| | Polyurethane resin | SUPERFLEX 470 | 9 | DKS Co. Ltd. | 1252 | 1742 | 0.530 | 45 |
| | Polyurethane resin | SUPERFLEX 740 | h | DKS Co. Ltd. | 1173 | 1730 | 1.361 | 40 |
| | Polyurethane resin | HYDRAN AP10 | i | DIC Corporation | 1241 | 1718 | 1.066 | 30 |
| | Polyurethane resin | HYDRAN AP201 | j | DIC Corporation | 1230 | 1724 | 0.901 | 23 |
| | Polyurethane resin | HYDRAN AP30F | k | DIC Corporation | 1229 | 1720 | 1.038 | 20 |
| | Polyester resin | Vylonal MD1100 | m | Toyobo Co., Ltd. | 1236 | 1718 | 1.153 | 30 |
| | Polyester resin | Vylonal MD1480 | n | Toyobo Co., Ltd. | 1234 | 1720 | 0.735 | 25 |
| | Polyester resin | Vylonal MD1985 | o | Toyobo Co., Ltd. | 1254 | 1715 | 1.283 | 27 |
| | Polyester resin | Vylonal MD1200 | p | Toyobo Co., Ltd. | 1242 | 1720 | 1.195 | 34 |
| | Polyester resin | Vylonal MD2000 | q | Toyobo Co., Ltd. | 1242 | 1720 | 1.196 | 40 |
| | Acrylic resin | VONCOAT AK3090 | r | DIC Corporation | 1167 | 1731 | 1.315 | 45 |
| | Acrylic resin | VONCOAT AN678E | s | DIC Corporation | 1162 | 1732 | 1.173 | 45 |
| | Acrylic resin | VONCOAT MAT-200-E | t | DIC Corporation | 1161 | 1730 | 1.368 | 45 |
| | Acrylic resin | VONCOAT ED85E | u | DIC Corporation | 1161 | 1729 | 1.391 | 45 |
| | Acrylic resin | VONCOAT R3310E | v | DIC Corporation | 1163 | 1733 | 1.237 | 45 |
| | Acrylic resin | VONCOAT AN1190S | w | DIC Corporation | 1147 | 1731 | 1.304 | 45 |
| | Polyolefin-based resin | ZAIKTHENE AC | x | Sumitomo Seika Chemicals Company Limited | 1241 | 1703 | 4.311 | 30 |
| Water-soluble resin (B) | Polyethylene oxide | ALKOX E-45 | — | Meisei Chemical Works, Ltd. | 1106 | — | — | — |
| | Polyethylene glycol | PEG4000S | — | Sanyo Chemical Industries, Ltd. | 1106 | — | — | — |
| Additive | Sodium formate | — | — | Mitsubishi Gas Chemical Company, Inc. | — | — | — | — |
| Solvent | Surface conditioner | BYK-349 | — | BYK Japan KK | — | — | — | — |
| | Ion-exchanged water | — | — | — | — | — | — | — |
| | Methanol | — | — | Mitsubishi Gas Chemical Company, Inc. | — | — | — | — |
| Metallic foil | Aluminum foil | JIS-A1100 H18 thickness: 0.1 mm | — | Mitsubishi Aluminum Company, Ltd. | — | — | — | — |

Hereinafter, the method for producing the entry sheets for drilling of Examples and Comparative Examples will be described.

Example 1

In a water/methanol mixed solvent (mass ratio of 50/50), 100 parts by mass (30 parts by mass in terms of solid content of resin) of an aqueous dispersion of a polyurethane resin (trade name: SUPERFLEX 820, manufactured by DKS Co. Ltd.), 7 parts by mass of a polyethylene oxide (trade name: ALKOX E-45, manufactured by Meisei Chemical Works, Ltd., weight average molecular weight of 560,000) as the high-molecular-weight water-soluble resin (b1), and 63 parts by mass of a polyethylene glycol (trade name: PEG 4000S, manufactured by Sanyo Chemical Industries, Ltd., weight average molecular weight of 3,300) as the low-molecular-weight water-soluble resin (b2) were dissolved to prepare a solution having a solid concentration of a resin composition of 30% by mass. Based on 100 parts by mass of the solid content of the resin composition in the solution, 1.2 parts by mass of a surface conditioner (BYK 349, manufactured by BYK JAPAN KK) were added to the solution, and, further, 0.25 parts by mass of sodium formate (manufactured by Mitsubishi Gas Chemical Company, Inc.) were added to the solution based on 100 parts by mass of the solid content of the resin composition in the solution. The resulting mixture was uniformly dispersed to obtain a solution of the resin composition for forming a layer of the resin composition. The obtained solution of the resin composition was applied on aluminum foil (aluminum foil used: JIS-A1100 H1.80, thickness of 0.1 mm, manufactured by Mitsubishi Aluminum Company, Ltd.) using a bar coater so that the layer of the resin composition after drying and solidification had a thickness of 0.05 mm. Subsequently, the applied solution was dried at 120° C. for 3 minutes using a dryer, and then cooled and solidified to make an entry sheet for drilling. The surface of the layer of the resin composition on the entry sheet for drilling was analyzed by infrared spectroscopy in the manner as described above, and the Abs(C—O)L and the Abs(C=O)L were determined from the obtained infrared absorption spectrum to work out the absorbance ratio (C). Moreover, the adhesion force between the metallic foil and the layer of the resin composition in the entry sheet for drilling was measured 3 times to determine the mean. These results are shown in Table 2.

Examples 2 to 39 and Comparative Examples 1 to 39

In accordance with Example 1, the solutions of the resin compositions were prepared according to the types and content ratios of materials as shown in Tables 2 to 5 to make entry sheets for drilling each having a thickness of the layer of the resin composition after drying and solidification of 0.05 mm. The peak position in IR, the absorbance ratio (C) in the layer of the resin composition, and the adhesion force between the metallic foil and the layer of the resin composition were measured for the obtained entry sheets for drilling. These results are shown in Tables 2 to 5 together with the absorbance ratios (D) in the water-insoluble resins (A).

The decision criteria for the adhesion force shown in Tables 2 to 5 are as follows. When the adhesion force between the metallic foil and the layer of the resin composition is weak, the layer of the resin composition is peeled because the load at the time of processing is applied to the entry sheet during drilling processing. As a result of diligent studies conducted by the present inventors, it has become clear that when the adhesion force is 200 gf or more, the layer of the resin composition is not peeled during drilling processing, so that the decision criteria have been determined such that the adhesion force of 200 gf or more was rated as "○", and the adhesion force of less than 200 gf was rated as "X".

TABLE 2

| Classification | Water-insoluble resin (A) | | | Water-soluble resin (B) | | Water-insoluble resin (A) Peak position attributable C—O bond cm$^{-1}$ |
|---|---|---|---|---|---|---|
| | Type of resin | Trade name | Sign | ALKOX E-45 Parts by mass | PEG4000S Parts by mass | |
| | | | | Parts by mass | | |
| Example 1 | Polyurethane resin | SUPERFLEX 820 | a | 30.0 | 7.0 | 63.0 | 1272 |
| Example 2 | Polyurethane resin | SUPERFLEX 820 | a | 35.0 | 6.5 | 58.5 | 1272 |
| Example 3 | Polyurethane resin | SUPERFLEX 820 | a | 40.0 | 6.0 | 54.0 | 1272 |
| Example 4 | Polyurethane resin | SUPERFLEX 820 | a | 45.0 | 5.5 | 49.5 | 1272 |
| Example 5 | Polyurethane resin | SUPERFLEX 820 | a | 50.0 | 5.0 | 45.0 | 1272 |
| Example 6 | Polyurethane resin | SUPERFLEX 820 | a | 75.0 | 2.5 | 22.5 | 1272 |
| Example 7 | Polyurethane resin | SUPERFLEX 860 | b | 52.2 | 4.8 | 43.0 | 1241 |
| Example 8 | Polyurethane resin | SUPERFLEX 860 | b | 57.1 | 4.3 | 38.6 | 1241 |
| Example 9 | Polyurethane resin | SUPERFLEX 210 | c | 77.8 | 2.2 | 20.0 | 1102 |
| Example 10 | Polyurethane resin | HYDRAN AP10 | i | 25.0 | 7.5 | 67.5 | 1241 |
| Example 11 | Polyurethane resin | HYDRAN AP10 | i | 30.0 | 7.0 | 63.0 | 1241 |
| Example 12 | Polyurethane resin | HYDRAN AP10 | i | 35.0 | 6.5 | 58.5 | 1241 |
| Example 13 | Polyurethane resin | HYDRAN AP10 | i | 50.0 | 5.0 | 45.0 | 1241 |
| Example 14 | Polyurethane resin | HYDRAN AP201 | j | 30.0 | 7.0 | 63.0 | 1230 |
| Example 15 | Polyurethane resin | HYDRAN AP201 | j | 35.0 | 6.5 | 58.5 | 1230 |
| Example 16 | Polyurethane resin | HYDRAN AP201 | j | 50.0 | 5.0 | 45.0 | 1230 |
| Example 17 | Polyurethane resin | HYDRAN AP30F | k | 50.0 | 5.0 | 45.0 | 1229 |
| Example 18 | Polyester resin | Vylonal MD1100 | m | 75.0 | 2.5 | 22.5 | 1236 |
| Example 19 | Polyester resin | Vylonal MD1480 | n | 71.4 | 2.9 | 25.7 | 1234 |
| Example 20 | Polyester resin | Vylonal MD1985 | o | 47.4 | 5.3 | 47.4 | 1254 |
| Example 21 | Polyester resin | Vylonal MD1985 | o | 73.0 | 2.7 | 24.3 | 1254 |
| Example 22 | Acrylic resin | VONCOAT AK3090 | r | 35.0 | 6.5 | 58.5 | 1167 |
| Example 23 | Acrylic resin | VONCOAT AK3090 | r | 40.0 | 6.0 | 54.0 | 1167 |
| Example 24 | Acrylic resin | VONCOAT AK3090 | r | 45.0 | 5.5 | 49.5 | 1167 |
| Example 25 | Acrylic resin | VONCOAT AK3090 | r | 50.0 | 5.0 | 45.0 | 1167 |

| Classification | Water-insoluble resin (A) | | Layer of resin composition | | | Adhesion force gf | Decision of adhesion force |
|---|---|---|---|---|---|---|---|
| | Peak position attributable C=O bond cm$^{-1}$ | Absorbance ratio (D) Abs(C=O)L/ Abs(C—O)L | Peak position attributable to C—O bond cm$^{-1}$ | Peak position attributable to C=O bond cm$^{-1}$ | Absorbance ratio (C) Abs(C=O)L/ Abs(C—O)L | | |
| Example 1 | 1718 | 0.891 | 1105 | 1715 | 0.130 | 210 | ○ |
| Example 2 | 1718 | 0.891 | 1106 | 1716 | 0.159 | >1000 | ○ |
| Example 3 | 1718 | 0.891 | 1106 | 1718 | 0.192 | >1000 | ○ |
| Example 4 | 1718 | 0.891 | 1107 | 1716 | 0.243 | >1000 | ○ |
| Example 5 | 1718 | 0.891 | 1107 | 1715 | 0.242 | >1000 | ○ |
| Example 6 | 1718 | 0.891 | 1107 | 1716 | 0.214 | >1000 | ○ |
| Example 7 | 1722 | 1.282 | 1108 | 1725 | 0.379 | 265 | ○ |

TABLE 2-continued

| | | | | | | | |
|---|---|---|---|---|---|---|---|
| Example 8 | 1722 | 1.282 | 1108 | 1725 | 0.430 | 380 | ○ |
| Example 9 | 1721 | 1.499 | 1108 | 1721 | 0.233 | >1000 | ○ |
| Example 10 | 1718 | 1.066 | 1106 | 1723 | 0.179 | 225 | ○ |
| Example 11 | 1718 | 1.066 | 1105 | 1723 | 0.199 | 365 | ○ |
| Example 12 | 1718 | 1.066 | 1105 | 1720 | 0.256 | >1000 | ○ |
| Example 13 | 1718 | 1.066 | 1107 | 1720 | 0.383 | >1000 | ○ |
| Example 14 | 1724 | 0.901 | 1107 | 1727 | 0.157 | >1000 | ○ |
| Example 15 | 1724 | 0.901 | 1108 | 1727 | 0.197 | >1000 | ○ |
| Example 16 | 1724 | 0.901 | 1109 | 1726 | 0.300 | 800 | ○ |
| Example 17 | 1720 | 1.038 | 1106 | 1723 | 0.312 | 350 | ○ |
| Example 18 | 1718 | 1.153 | 1107 | 1719 | 0.716 | 223 | ○ |
| Example 19 | 1720 | 0.735 | 1110 | 1721 | 0.475 | >1000 | ○ |
| Example 20 | 1715 | 1.283 | 1105 | 1716 | 0.309 | 275 | ○ |
| Example 21 | 1715 | 1.283 | 1105 | 1715 | 0.487 | >1000 | ○ |
| Example 22 | 1731 | 1.315 | 1107 | 1731 | 0.331 | 327 | ○ |
| Example 23 | 1731 | 1.315 | 1108 | 1731 | 0.418 | 443 | ○ |
| Example 24 | 1731 | 1.315 | 1109 | 1731 | 0.561 | 275 | ○ |
| Example 25 | 1731 | 1.315 | 1110 | 1731 | 0.792 | 275 | ○ |

Decision critera for adhesion force
200 gf or more: ○
Less than 200 gf: X

TABLE 3

| Classification | Water-insoluble resin (A) Type of resin | Water-insoluble resin (A) Trade name | Water-insoluble resin (A) Sign | Water-insoluble resin (A) Parts by mass | Water-soluble resin (B) ALKOX E-45 Parts by mass | Water-soluble resin (B) PEG-4000S Parts by mass | Water-insoluble resin (A) Peak position attributable C—O bond cm$^{-1}$ |
|---|---|---|---|---|---|---|---|
| Example 26 | Acrylic resin | VONCOAT AK3090 | r | 70.0 | 3.0 | 27.0 | 1167 |
| Example 27 | Acrylic resin | VONCOAT AN678E | s | 40.0 | 6.0 | 54.0 | 1162 |
| Example 28 | Acrylic resin | VONCOAT AN678E | s | 41.0 | 5.9 | 53.1 | 1162 |
| Example 29 | Acrylic resin | VONCOAT AN678E | s | 43.0 | 5.7 | 51.3 | 1162 |
| Example 30 | Acrylic resin | VONCOAT AN678E | s | 45.0 | 5.5 | 49.5 | 1162 |
| Example 31 | Acrylic resin | VONCOAT AN678E | s | 50.0 | 5.0 | 45.0 | 1162 |
| Example 32 | Acrylic resin | VONCOAT MAT-200-E | t | 45.0 | 5.5 | 49.5 | 1161 |
| Example 33 | Acrylic resin | VONCOAT MAT-200-E | t | 46.0 | 5.4 | 48.6 | 1161 |
| Example 34 | Acrylic resin | VONCOAT MAT-200-E | t | 48.0 | 5.2 | 46.8 | 1161 |
| Example 35 | Acrylic resin | VONCOAT MAT-200-E | t | 50.0 | 5.0 | 45.0 | 1161 |
| Example 36 | Polyolefin-based resin | ZAIKTHENE AC | x | 21.7 | 7.8 | 70.4 | 1241 |
| Example 37 | Polyolefin-based resin | ZAIKTHENE AC | x | 30.0 | 7.0 | 63.0 | 1241 |
| Example 38 | Polyolefin-based resin | ZAIKTHENE AC | x | 50.0 | 5.0 | 45.0 | 1241 |
| Example 39 | Polyolefin-based resin | ZAIKTHENE AC | x | 71.4 | 2.9 | 25.7 | 1241 |

| Classification | Water-insoluble resin (A) Peak position attributable C=O bond cm$^{-1}$ | Water-insoluble resin (A) Absorbance ratio (D) Abs(C=O)A/Abs(C—O)A | Layer of resin composition Peak position attributable C—O bond cm$^{-1}$ | Layer of resin composition Peak position attributable C=O bond cm$^{-1}$ | Layer of resin composition Absorbance ratio (C) Abs(C=O)L/Abs(C—O)L | Adhesion force gf | Decision of adhesion force |
|---|---|---|---|---|---|---|---|
| Example 26 | 1731 | 1.315 | 1109 | 1732 | 1.308 | >1000 | ○ |
| Example 27 | 1732 | 1.173 | 1108 | 1732 | 0.513 | 320 | ○ |
| Example 28 | 1732 | 1.173 | 1109 | 1733 | 0.511 | 537 | ○ |
| Example 29 | 1732 | 1.173 | 1109 | 1733 | 0.557 | 553 | ○ |
| Example 30 | 1732 | 1.173 | 1109 | 1732 | 0.638 | 475 | ○ |
| Example 31 | 1732 | 1.173 | 1109 | 1732 | 0.698 | >1000 | ○ |

TABLE 3-continued

| | | | | | | | |
|---|---|---|---|---|---|---|---|
| Example 32 | 1730 | 1.368 | 1109 | 1731 | 0.433 | >1000 | ○ |
| Example 33 | 1730 | 1.368 | 1109 | 1732 | 0.467 | 567 | ○ |
| Example 34 | 1730 | 1.368 | 1109 | 1732 | 0.496 | 773 | ○ |
| Example 35 | 1730 | 1.368 | 1109 | 1731 | 0.474 | >1000 | ○ |
| Example 36 | 1703 | 4.311 | 1105 | 1703 | 0.120 | 317 | ○ |
| Example 37 | 1703 | 4.311 | 1109 | 1703 | 0.633 | 325 | ○ |
| Example 38 | 1703 | 4.311 | 1102 | 1704 | 0.796 | >1000 | ○ |
| Example 39 | 1703 | 4.311 | 1107 | 1703 | 0.487 | 533 | ○ |

Decision critera for adhesion force
200 gf or more: ○
Less than 200 gf: X

TABLE 4

| Classification | Water-insoluble resin (A) | | | | Amount of water-soluble resin (B) blended | | Water-insoluble resin (A) Peak position attributable to C—O bond cm$^{-1}$ |
|---|---|---|---|---|---|---|---|
| | Type of resin | Trade names | Sign | Parts by mass | ALKOX E-45 Parts by mass | PEG-4000S Parts by mas | |
| Comparative Example 1 | PEO/PEG | Not blende | — | 0.0 | 10.0 | 90.0 | — |
| Comparative Example 2 | Polyurethane resin | SUPERFLEX 820 | a | 5.0 | 9.5 | 85.5 | 1272 |
| Comparative Example 3 | Polyurethane resin | SUPERFLEX 820 | a | 10.0 | 9.0 | 81.0 | 1272 |
| Comparative Example 4 | Polyurethane resin | SUPERFLEX 820 | a | 15.0 | 8.5 | 76.5 | 1272 |
| Comparative Example 5 | Polyurethane resin | SUPERFLEX 820 | a | 20.0 | 8.0 | 72.0 | 1272 |
| Comparative Example 6 | Polyurethane resin | SUPERFLEX 820 | a | 25.0 | 7.5 | 67.5 | 1272 |
| Comparative Example 7 | Polyurethane resin | SUPERFLEX 130 | d | 28.0 | 7.2 | 64.8 | 1088 |
| Comparative Example 8 | Polyurethane resin | SUPERFLEX 300 | e | 5.0 | 9.5 | 85.5 | 1171 |
| Comparative Example 9 | Polyurethane resin | SUPERFLEX 300 | e | 10.0 | 9.0 | 81.0 | 1171 |
| Comparative Example 10 | Polyurethane resin | SUPERFLEX 300 | e | 15.0 | 8.5 | 76.5 | 1171 |
| Comparative Example 11 | Polyurethane resin | SUPERFLEX 300 | e | 20.0 | 8.0 | 72.0 | 1171 |
| Comparative Example 12 | Polyurethane resin | SUPERFLEX 300 | e | 25.0 | 7.5 | 67.5 | 1171 |
| Comparative Example 13 | Polyurethane resin | SUPERFLEX 300 | e | 30.0 | 7.0 | 63.0 | 1171 |
| Comparative Example 14 | Polyurethane resin | SUPERFLEX 300 | e | 35.0 | 6.5 | 58.5 | 1171 |
| Comparative Example 15 | Polyurethane resin | SUPERFLEX 500M | f | 29.7 | 7.0 | 63.3 | 1115 |
| Comparative Example 16 | Polyurethane resin | SUPERFLEX 500M | f | 55.9 | 4.4 | 39.7 | 1115 |
| Comparative Example 17 | Polyurethane resin | SUPERFLEX 470 | g | 33.3 | 6.7 | 60.0 | 1252 |
| Comparative Example 18 | Polyurethane resin | SUPERFLEX 470 | g | 60.0 | 4.0 | 36.0 | 1252 |
| Comparative Example 19 | Polyurethane resin | SUPERFLEX 470 | g | 81.8 | 1.8 | 16.4 | 1252 |
| Comparative Example 20 | Polyurethane resin | SUPERFLEX 740 | h | 30.8 | 6.9 | 62.3 | 1173 |
| Comparative Example 21 | Polyurethane resin | HYDRAN AP10 | i | 10.0 | 9.0 | 81.0 | 1241 |
| Comparative Example 22 | Polyurethane resin | HYDRAN AP10 | i | 15.0 | 8.5 | 76.5 | 1241 |
| Comparative Example 23 | Polyurethane resin | HYDRAN AP201 | j | 10.0 | 9.0 | 81.0 | 1230 |
| Comparative Example 24 | Polyurethane resin | HYDRAN AP201 | j | 15.0 | 8.5 | 76.5 | 1230 |
| Comparative Example 25 | Polyurethane resin | HYDRAN AP201 | j | 20.0 | 8.0 | 72.0 | 1230 |

TABLE 4-continued

| Classification | Water-insoluble resin (A) | | Water-insoluble resin (A) | | | Adhesion force gf | Decision of adhesion force |
|---|---|---|---|---|---|---|---|
| | Peak position attributable to C=O bond cm$^{-1}$ | Absorbance ratio (D) Abs(C=O)A/Abs(C—O)A | Peak position attributable to C—O bond cm$^{-1}$ | Peak position attributable to C=O bond cm$^{-1}$ | Absorbance ratio (C) Abs(C=O)L/Abs(C—O)L | | |
| Comparative Example 1 | — | — | — | — | — | 0 | X |
| Comparative Example 2 | 1718 | 0.891 | 1106 | 1715 | 0.031 | 0 | X |
| Comparative Example 3 | 1718 | 0.891 | 1106 | 1718 | 0.057 | 0 | X |
| Comparative Example 4 | 1718 | 0.891 | 1103 | 1716 | 0.052 | 0 | X |
| Comparative Example 5 | 1718 | 0.891 | 1104 | 1719 | 0.090 | 28 | X |
| Comparative Example 6 | 1718 | 0.891 | 1105 | 1716 | 0.110 | 60 | X |
| Comparative Example 7 | 1697 | 1.789 | 1102 | 1699 | 0.112 | 125 | X |
| Comparative Example 8 | 1731 | 1.313 | 1101 | 1718 | 0.019 | 0 | X |
| Comparative Example 9 | 1731 | 1.313 | 1106 | 1717 | 0.030 | 0 | X |
| Comparative Example 10 | 1731 | 1.313 | 1104 | 1732 | 0.050 | 0 | X |
| Comparative Example 11 | 1731 | 1.313 | 1106 | 1733 | 0.073 | 0 | X |
| Comparative Example 12 | 1731 | 1.313 | 1105 | 1732 | 0.105 | 0 | X |
| Comparative Example 13 | 1731 | 1.313 | 1105 | 1732 | 0.107 | 0 | X |
| Comparative Example 14 | 1731 | 1.313 | 1107 | 1732 | 0.109 | 9 | X |
| Comparative Example 15 | 1730 | 1.220 | 1102 | 1732 | 0.034 | 43 | X |
| Comparative Example 16 | 1730 | 1.220 | 1107 | 1730 | 0.010 | 27 | X |
| Comparative Example 17 | 1742 | 0.530 | 1103 | 1742 | 0.014 | 33 | X |
| Comparative Example 18 | 1742 | 0.530 | 1100 | 1744 | 0.002 | 100 | X |
| Comparative Example 19 | 1742 | 0.530 | 1103 | 1746 | 0.015 | 57 | X |
| Comparative Example 20 | 1730 | 1.361 | 1106 | 1731 | 0.113 | 0 | X |
| Comparative Example 21 | 1718 | 1.066 | 1107 | 1723 | 0.069 | 0 | X |
| Comparative Example 22 | 1718 | 1.066 | 1107 | 1723 | 0.101 | 0 | X |
| Comparative Example 23 | 1724 | 0.901 | 1108 | 1728 | 0.057 | 15 | X |
| Comparative Example 24 | 1724 | 0.901 | 1108 | 1728 | 0.090 | 43 | X |
| Comparative Example 25 | 1724 | 0.901 | 1106 | 1730 | 0.117 | 80 | X |

Decision criteria for adhesion force 200 gf or more: ○

Less than 200 gf: X

TABLE 5

| Classification | Water-insoluble resin (A) Type of resin | Water-insoluble resin (A) Trade names | Water-insoluble resin (A) Sign | Water-insoluble resin (A) Part by mass | Amount of water-soluble resin (B) blended ALKOX E-45 Part by mass | Amount of water-soluble resin (B) blended PEG-4000S Part by mass | Water-insoluble resin (A) Peak position attributable to C—O bond cm$^{-1}$ |
|---|---|---|---|---|---|---|---|
| Comparative Example 26 | Polyester resin | Vylonal MD1200 | p | 27.4 | 7.3 | 65.3 | 1242 |
| Comparative Example 27 | Polyester resin | Vylonal MD2000 | q | 57.1 | 4.3 | 38.6 | 1242 |
| Comparative Example 28 | Polyester resin | Vylonal MD2000 | q | 80.0 | 2.0 | 18.0 | 1242 |
| Comparative Example 29 | Acrylic resin | VONCOAT AK3090 | r | 10.0 | 9.0 | 81.0 | 1167 |
| Comparative Example 30 | Acrylic resin | VONCOAT AK3090 | r | 82.0 | 1.8 | 16.2 | 1167 |
| Comparative Example 31 | Acrylic resin | VONCOAT AK3090 | r | 85.0 | 1.5 | 13.5 | 1167 |
| Comparative Example 32 | Acrylic resin | VONCOAT AN678E | s | 10.0 | 9.0 | 81.0 | 1162 |
| Comparative Example 33 | Acrylic resin | VONCOAT MAT-200-E | t | 10.0 | 9.0 | 81.0 | 1161 |
| Comparative Example 34 | Acrylic resin | VONCOAT ED85E | u | 10.0 | 9.0 | 81.0 | 1161 |
| Comparative Example 35 | Acrylic resin | VONCOAT R3310E | v | 10.0 | 9.0 | 81.0 | 1163 |
| Comparative Example 36 | Acrylic resin | VONCOAT AN1190S | w | 10.0 | 9.0 | 81.0 | 1147 |
| Comparative Example 37 | Polyolefin-based resin | ZAIKTHENE AC | x | 5.0 | 9.5 | 85.5 | 1241 |
| Comparative Example 38 | Polyolefin-based resin | ZAIKTHENE AC | x | 10.0 | 9.0 | 81.0 | 1241 |
| Comparative Example 39 | Polyolefin-based resin | ZAIKTHENE AC | x | 15.0 | 8.5 | 76.5 | 1241 |

| Classification | Water-insoluble resin (A) Peak position attributable to C=O bond cm$^{-1}$ | Water-insoluble resin (A) Absorbance ratio (D) Abs(C=O)A/Abs(C—O)A | Layer of resin composition Peak position attributable to C—O bond cm$^{-1}$ | Layer of resin composition Peak position attributable to C=O bond cm$^{-1}$ | Absorbance ratio (C) Abs(C=O)L/Abs(C—O)L | Adhesion force gf | Decision of adhesion force |
|---|---|---|---|---|---|---|---|
| Comparative Example 26 | 1720 | 1.195 | 1107 | 1721 | 0.095 | 63 | X |
| Comparative Example 27 | 1720 | 1.196 | 1106 | 1725 | 0.103 | 0 | X |
| Comparative Example 28 | 1720 | 1.196 | 1100 | 1725 | 0.019 | 0 | X |
| Comparative Example 29 | 1731 | 1.315 | 1101 | 1733 | 0.056 | 0 | X |
| Comparative Example 30 | 1731 | 1.315 | 1116 | 1732 | 1.915 | >1000 | ○ |
| Comparative Example 31 | 1731 | 1.315 | 1116 | 1732 | 2.587 | >1000 | ○ |
| Comparative Example 32 | 1732 | 1.173 | 1102 | 1734 | 0.076 | 0 | X |
| Comparative Example 33 | 1730 | 1.368 | 1102 | 1733 | 0.061 | 0 | X |
| Comparative Example 34 | 1729 | 1.391 | 1102 | 1733 | 0.082 | 0 | X |
| Comparative Example 35 | 1733 | 1.237 | 1102 | 1735 | 0.089 | 0 | X |
| Comparative Example 36 | 1731 | 1.304 | 1101 | 1733 | 0.077 | 0 | X |
| Comparative Example 37 | 1703 | 4.311 | 1102 | 1704 | 0.011 | 0 | X |

TABLE 5-continued

| | | | | | | | |
|---|---|---|---|---|---|---|---|
| Comparative Example 38 | 1703 | 4.311 | 1102 | 1703 | 0.030 | 0 | X |
| Comparative Example 39 | 1703 | 4.311 | 1101 | 1703 | 0.050 | 0 | X |

Decision criteria for adhesion force
200 gf or more: ○
Less than 200 gf: X

Table 6 is a table that shows the relation among the absorbance ratio (C) in the layer of the resin composition, the adhesion force, and the hole position accuracy. The decision criteria for the hole position accuracy are as follows. When the hole position accuracy worked out by method of the expression (3) is 20 μm or less, the hole position accuracy is denoted as "○" meaning that the property is excellent, and when the hole position accuracy is more than 20 μm, the hole position accuracy is denoted as "X". Moreover, when both the decision of the hole position accuracy and the decision of the adhesion force are "○", the comprehensive decision is denoted as "○" because the adhesion strength between the metallic foil and the layer of the resin composition is strong and the hole position accuracy is excellent, and when at least one of the decision of the hole position accuracy and the decision of the adhesion force is "X", the comprehensive decision is denoted as "X".

hole position accuracy was poor. Moreover, the adhesion force between the metallic foil and the layer of the resin composition was strong for the entry sheets for drilling of Comparative Example 30 and Comparative Example 31 in which the absorbance ratio (C) exceeded 1.80, but the chip discharging property was poor because of a poor lubricating property, so that the hole position accuracy was poor.

That is, it is understood from the results in Tables 2 to 6 that when the layer of the resin composition has an absorbance ratio (C) of less than 0.12, the adhesion strength between the layer of the resin composition and the metallic foil is weak and the layer of the resin composition is peeled during drilling processing, so that the hole position accuracy is deteriorated. On the other hand, it is understood that when the layer of the resin composition has an absorbance ratio (C) exceeding 1.80, the adhesion strength between the layer of the resin composition and the metallic foil is sufficient,

TABLE 6

| Classification | Types of resin | Trade name of water-insoluble resin (A) | Sign | Absorbance ratio (C) ABS(C=O)L/ Abs(C—O)L | Hole position accuracy μm | Adhesion force gf | Decision of hole position accuracy (*1) | Decision of adhesion force (*2) | Comprehensive Decision |
|---|---|---|---|---|---|---|---|---|---|
| Example 4 | Polyurethane resin | SUPERFLEX 820 | a | 0.243 | 17.2 | >1000 | ○ | ○ | ○ |
| Example 22 | Acrylic resin | VONCOAT AK3090 | r | 0.331 | 17.6 | 327 | ○ | ○ | ○ |
| Example 26 | Acrylic resin | VONCOAT AK3090 | r | 1.308 | 19.7 | >1000 | ○ | ○ | ○ |
| Example 38 | Polyolefin-based resin | ZAIKTHENE AC | x | 0.796 | 18.5 | >1000 | ○ | ○ | ○ |
| Comparative Example 1 | PEO/PEG | Not blende | — | — | 21.5 | 0 | X | X | X |
| Comparative Example 4 | Polyurethane resin | SUPERFLEX 820 | a | 0.052 | 21.8 | 0 | X | X | X |
| Comparative Example 28 | Polyester resin | Vylonal MD2000 | q | 0.019 | 73.2 | 0 | X | X | X |
| Comparative Example 30 | Acrylic resin | VONCOAT AK3090 | r | 1.915 | 24.0 | >1000 | X | ○ | X |
| Comparative Example 31 | Acrylic resin | VONCOAT AK3090 | r | 2.587 | 23.3 | >1000 | X | ○ | X |
| Comparative Example 39 | Polyolefin-based resin | ZAIKTHENE AC | x | 0.050 | 53.6 | 0 | X | X | X |

(*1) Decision criteria for hole position accuracy hole position accuracy of 20 μm or less: ○ hole position accuracy of larger than 20 μm: X
(*2) Decision criteria for adhesion force adhesion force of 200 gf or more: ○ adhesion force of less than 200 gf: X In FIG. 1, the relation between the absorbance ratio (C) in the layer of the resin composition and the adhesion force between the metallic foil and the layer of the resin composition in Examples and Comparative Examples are plotted. It is understood from FIG. 1 that when the absorbance ratio (C) in the layer of the resin composition is from 0.12 to 1.80 or less, the adhesion force is satisfactory.

It is understood from Table 6 that the adhesion force between the metallic foil and the layer of the resin composition is strong, and the hole position accuracy is satisfactory for the entry sheets for drilling of Example 4, Example 22, Example 26, and Example 38 in which the layer of the resin composition has an absorbance ratio (C) of 0.12 to 1.80 or less. On the other hand, the adhesion force between the metallic foil and the layer of the resin composition was weak for the entry sheets for drilling of Comparative Example 1, Comparative Example 4, Comparative Example 28, and Comparative Example 39 in which the absorbance ratio (C) was less than 0.12, so that the peeling of the layer of the resin composition occurred during drilling processing, and the hole position accuracy was poor.

but instead, the lubricating property becomes poor and the chips are not discharged smoothly, so that the hole position accuracy is deteriorated.

The present application claims priority based on Japanese Patent Application (Japanese Patent Application No. 2015-056155) filed with Japan Patent Office on Mar. 19, 2015, the contents of which are hereby incorporated with reference.

INDUSTRIAL APPLICABILITY

The present invention has industrial applicability as an entry sheet for drilling that is used during drilling processing or the like of a laminated board or a multi-layer board. Particularly, the present invention can provide an entry sheet for drilling that makes the hole position accuracy more excellent, that makes the breakage of a drill due to peeling of a layer of a resin composition from metallic foil less frequent, and that is more excellent in economy because an adhesion layer, which has been necessary so far, is unnecessary than conventional entry sheets for drilling.

The invention claimed is:

1. An entry sheet for drilling comprising:
a metallic foil; and
a layer of a resin composition, the layer formed on the metallic foil without interposing an adhesion layer, wherein
the layer of the resin composition has a peak attributable to a carbon atom-oxygen atom double bond appearing at 1700 to 1750 cm$^{-1}$ and a peak attributable to a carbon atom-oxygen atom single bond appearing at 1080 to 1300 cm$^{-1}$ in an infrared spectroscopy, and
when an absorbance at the peak attributable to the carbon atom-oxygen atom double bond appearing at 1700 to 1750 cm$^{-1}$ is represented by Abs(C=O)L, and an absorbance at the peak of the carbon atom-oxygen atom single bond appearing at 1080 to 1300 cm$^{-1}$ is represented by Abs(C—O)L, the layer of the resin composition has an absorbance ratio (C) of 0.12 to 1.80, the absorbance ratio (C) represented by expression (1):

Absorbance ratio(C)=Abs(C=O)L/Abs(C—O)L  Expression (1).

2. The entry sheet for drilling according to claim 1, wherein the resin composition comprises:
a water-insoluble resin (A) having the peak attributable to the carbon atom-oxygen atom double bond appearing at 1700 to 1750 cm$^{-1}$ in the infrared spectroscopy; and
a water-soluble resin (B) having the peak attributable to the carbon atom-oxygen atom single bond appearing at 1080 to 1300 cm$^{-1}$ in the infrared spectroscopy.

3. The entry sheet for drilling according to claim 2, wherein the water-insoluble resin (A) is one or more selected from the group consisting of polyurethane resins, polyester resins, acrylic-based resins, and polyolefin-based resins.

4. The entry sheet for drilling according to claim 2, wherein the water-soluble resin (B) is one or more selected from the group consisting of polyethylene oxide; polypropylene oxide; cellulose derivatives; polytetramethylene glycol; polyethylene glycol; polypropylene glycol; monoether compounds of polyoxyethylene; polyoxyethylene monostearate; polyoxyethylene sorbitan monostearate; polyglycerin monostearate compounds; and a polyoxyethylene-propylene copolymer.

5. The entry sheet for drilling according to claim 4, wherein
the water-soluble resin (B) comprises:
a high-molecular-weight water-soluble resin (b1) having a weight average molecular weight of 50,000 or higher and 1,000,000 or lower; and
a low-molecular-weight water-soluble resin (b2) having a weight average molecular weight of 1,000 or higher and 30,000 or lower, and
the high-molecular-weight water-soluble resin (b1) comprises at least one selected from the group consisting of polyethylene oxide, polypropylene oxide, and cellulose derivatives, and
the low-molecular-weight water-soluble resin (b2) comprises at least one selected from the group consisting of polytetramethylene glycol; polyethylene glycol; polypropylene glycol; monoether compounds of polyoxyethylene; polyoxyethylene monostearate; polyoxyethylene sorbitan monostearate; polyglycerin monostearate compounds; and a polyoxyethylene-propylene copolymer.

6. The entry sheet for drilling according to claim 2, wherein the resin composition comprises:
20 to 80 parts by mass of the water-insoluble resin (A); and
80 to 20 parts by mass of the water-soluble resin (B) each based on 100 parts by mass of a total amount of the water-insoluble resin (A) and the water-soluble resin (B).

7. The entry sheet for drilling according to claim 2, wherein the layer of the resin composition is formed using: an aqueous dispersion of the water-insoluble resin (A); and the water-soluble resin (B).

8. The entry sheet for drilling according to claim 1, wherein the layer of the resin composition has a thickness of 0.02 to 0.3 mm.

9. The entry sheet for drilling according to claim 1, wherein the metallic foil has a thickness of 0.05 to 0.5 mm.

10. A method for drilling processing, the method comprising a hole formation step of forming a hole in a laminated board or a multi-layer board using the entry sheet for drilling according to claim 1.

* * * * *